US010777695B2

(12) United States Patent
Tanaka et al.

(10) Patent No.: US 10,777,695 B2
(45) Date of Patent: Sep. 15, 2020

(54) PHOTOELECTRONIC SENSOR AND SENSOR SYSTEM

(71) Applicant: OMRON Corporation, Kyoto (JP)

(72) Inventors: Motoki Tanaka, Kyoto (JP); Tsuyoshi Miyata, Kyoto (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 16/251,102

(22) Filed: Jan. 18, 2019

(65) Prior Publication Data

US 2019/0288128 A1    Sep. 19, 2019

(30) Foreign Application Priority Data

Mar. 14, 2018  (JP) ................. 2018-047350

(51) Int. Cl.
  *H01L 31/0232*     (2014.01)
  *H01L 31/0216*     (2014.01)
  (Continued)

(52) U.S. Cl.
  CPC ........ *H01L 31/0232* (2013.01); *G01S 7/4811* (2013.01); *G01S 7/4815* (2013.01);
  (Continued)

(58) Field of Classification Search
  CPC ........... H01L 31/0232; H01L 31/02164; G01S 17/04; G01S 7/4811; G01S 7/4815
  See application file for complete search history.

(56) References Cited

U.S. PATENT DOCUMENTS

| 5,225,689 A | 7/1993 | Buckle et al. |
| 2014/0253879 A1* | 9/2014 | Schuck ................ G02B 26/008 353/8 |

(Continued)

FOREIGN PATENT DOCUMENTS

| CN | 104737305 | 6/2015 |
| DE | 4140614 | 6/1993 |

(Continued)

OTHER PUBLICATIONS

"Search Report of Europe Counterpart Application", dated Jul. 26, 2019, pp. 1-9.

(Continued)

*Primary Examiner* — Nathan W Ha
(74) *Attorney, Agent, or Firm* — JCIPRNET

(57) ABSTRACT

A photoelectronic sensor or the like capable of improving operation stability is provided. The photoelectronic sensor includes a light projecting unit having a light projecting lens that converges light and a light projecting element that projects light toward a reflective plate via the light projecting lens, and a light receiving unit disposed alongside the light projecting unit and having a light receiving lens that concentrates reflected light from the reflective plate and a light receiving element that receives the reflected light via the light receiving lens. The light projecting element has a light emitting area located on a side closer to the light receiving element than an optical axis of the light projecting lens and emitting light, and a non-light emitting area located on a side farther from the light receiving element than the optical axis and not emitting light.

5 Claims, 7 Drawing Sheets

(51) Int. Cl.
    *G01V 8/14*     (2006.01)
    *G01S 7/481*    (2006.01)
    *G01V 8/22*     (2006.01)
    *G01S 17/04*    (2020.01)
(52) U.S. Cl.
    CPC ............... *G01S 17/04* (2020.01); *G01V 8/14* (2013.01); *G01V 8/22* (2013.01); *H01L 31/02164* (2013.01)

(56) References Cited

U.S. PATENT DOCUMENTS

| | | | |
|---|---|---|---|
| 2015/0212208 A1 | 7/2015 | Hanada et al. | |
| 2017/0225568 A1* | 8/2017 | Kasahara | G02B 27/0101 |
| 2017/0261846 A1* | 9/2017 | Maes | G03B 17/54 |
| 2017/0276546 A1* | 9/2017 | Sakai | H04N 9/3194 |
| 2017/0276938 A1* | 9/2017 | Nakashima | B60R 11/02 |
| 2017/0282783 A1* | 10/2017 | Ravier | F21S 41/16 |
| 2017/0365049 A1* | 12/2017 | Ioachim | B29C 70/384 |
| 2017/0366789 A1* | 12/2017 | Shimizu | G02B 7/023 |
| 2018/0017857 A1* | 1/2018 | Nagumo | G03B 21/14 |
| 2018/0058843 A1* | 3/2018 | Tabuchi | G01B 11/2513 |
| 2018/0059414 A1* | 3/2018 | Campbell | G02B 27/0172 |
| 2018/0067308 A1* | 3/2018 | Sakai | G02B 27/0101 |
| 2018/0073957 A1* | 3/2018 | Sato | G01M 11/0214 |
| 2018/0087901 A1* | 3/2018 | Komeichi | G01S 17/86 |
| 2018/0088688 A1* | 3/2018 | Otani | H04N 9/3179 |
| 2018/0109695 A1* | 4/2018 | Takahashi | H04N 1/19589 |
| 2018/0129058 A1* | 5/2018 | Morrison | G02B 5/32 |

FOREIGN PATENT DOCUMENTS

| | | |
|---|---|---|
| JP | 3451524 | 9/2003 |
| JP | 2010256183 | 11/2010 |
| JP | 2011004230 | 1/2011 |
| JP | 2015172564 | 10/2015 |

OTHER PUBLICATIONS

Office Action of European Counterpart Application, dated Jan. 27, 2020, pp. 1-7.

"Office Action of China Counterpart Application", dated Jul. 28, 2020, with English translation thereof, p. 1-p. 12.

* cited by examiner

PHOTOELECTRONIC SENSOR AND SENSOR SYSTEM

CROSS-REFERENCE TO RELATED APPLICATION

This application claims the priority benefit of Japan Application No. 2018-047350, filed on Mar. 14, 2018. The entirety of the above-mentioned patent application is hereby incorporated by reference herein and made a part of this specification.

BACKGROUND

Technical Field

The present disclosure relates to a photoelectronic sensor and a sensor system.

Related Art

Among photoelectronic sensors for detecting existence of an object or the like exists a retroreflective photoelectronic sensor that has a light projecting unit and a light receiving unit (hereinafter referred to as a "light projecting and receiving unit") disposed alongside each other and projects light toward a reflective plate that is disposed facing the light projecting and receiving unit with a detection region sandwiched therebetween (e.g., see Patent Document 1, etc.). When the light from the light projecting unit is reflected to the light receiving unit by the reflective plate, the retroreflective photoelectronic sensor grasps a reduction in the amount of light received by the light receiving unit due to shielding of the light by a detected object, and performs detection of the existence of the detected object, and the like.

In such a retroreflective photoelectronic sensor, in the case where a surface of the detected object is specular, since mirror reflected light reflected by the specular surface may be received by the light receiving unit, there is a possibility that a malfunction (hereinafter referred to as a "specular malfunction") that determines nonexistence of the detected object may occur, even though the detected object exists in the detection area. Therefore, the retroreflective photoelectronic sensor has a problem with stability of a detection operation led to by the specular malfunction.

Accordingly, as exemplified in FIG. 6, there has been proposed an approach of providing a light shielding plate S having a slit in front of a light receiving element 300, using the fact that mirror reflected light 520 from a specular object W and reflected light 420 from a reflective plate 200 have different incident angles with respect to an optical axis of a light receiving lens 320. The approach uses the fact that the reflected light 420 passes through the slit of the light shielding plate S and is incident on the light receiving element 300, while the mirror reflected light 520 is shielded by the light shielding plate S.

PATENT DOCUMENT(S)

[Patent Document 1] Japanese Laid-open No. 2015-172564

However, as exemplified in FIG. 7, in the actual retroreflective photoelectronic sensor, light from a light projecting element 100 spreads conically to be projected. The conically spreading light includes, for example, projection light 500 from an area 100a on a side closer to the light receiving element 300 than an optical axis P of a light projecting lens 120 and projection light 600 from an area 100b on a side farther from the light receiving element 300 than the optical axis P, with respect to the specular object W. In the above method of shielding the mirror reflected light by the light shielding plate S, as illustrated in an enlarged view of the vicinity of the light receiving element 300 in the lower portion of FIG. 7, since the reflected light 420 from the reflective plate 200 and mirror reflected light 620 caused by the projection light 600 have no difference in incident angle with respect to an optical axis of the light receiving lens 320, both the reflected light 420 and the mirror reflected light 620 may pass through the slit of the light shielding plate S, and it is difficult to shield the mirror reflected light 620 by the light shielding plate S.

The present disclosure provides a photoelectronic sensor and a sensor system capable of easily improving stability of the detection operation.

SUMMARY

A photoelectronic sensor according to an embodiment of the present disclosure includes: a light projecting unit, having a light projecting lens converging light and a light projecting element projecting light toward a reflective plate via the light projecting lens; and a light receiving unit disposed alongside the light projecting unit, having a light receiving lens concentrating reflected light from the reflective plate and a light receiving element receiving the reflected light via the light receiving lens, wherein the light projecting element has a light emitting area and a non-light emitting area, the light emitting area being located on a side closer to the light receiving element than an optical axis of the light projecting lens and emitting light and the non-light emitting area being located on a side farther from the light receiving element than the optical axis and not emitting light.

A sensor system according to an embodiment of the present disclosure includes the photoelectronic sensor, and a relay apparatus receiving control data for controlling the photoelectronic sensor from an external terminal apparatus connected via a network, wherein the photoelectronic sensor further has a communication interface capable of digitally communicating with the relay apparatus, and the light projecting element causes an area located on a side closer to the light receiving element than the optical axis of the light projecting lens to emit light and causes an area located on a side farther from the light receiving element than the optical axis to not emit light based on the control data received from the replay apparatus.

BRIEF DESCRIPTION OF THE DRAWINGS

FIGS. 3A and 3B are schematic diagrams illustrating light emitting patterns of the light projecting element according to the first embodiment, wherein FIG. 3A shows the case where a light emitting area and a non-light emitting area are formed, and FIG. 3B shows the case where only the light emitting area is formed.

FIGS. 5A and 5B are schematic diagrams illustrating light emitting patterns of a light projecting element according to the second embodiment, wherein FIG. 5A shows the case where an area where light emitting elements are disposed is divided into two areas, and FIG. 5B shows the case where the area where the light emitting elements are disposed is divided into four areas.

DESCRIPTION OF THE EMBODIMENTS

Figure 1:
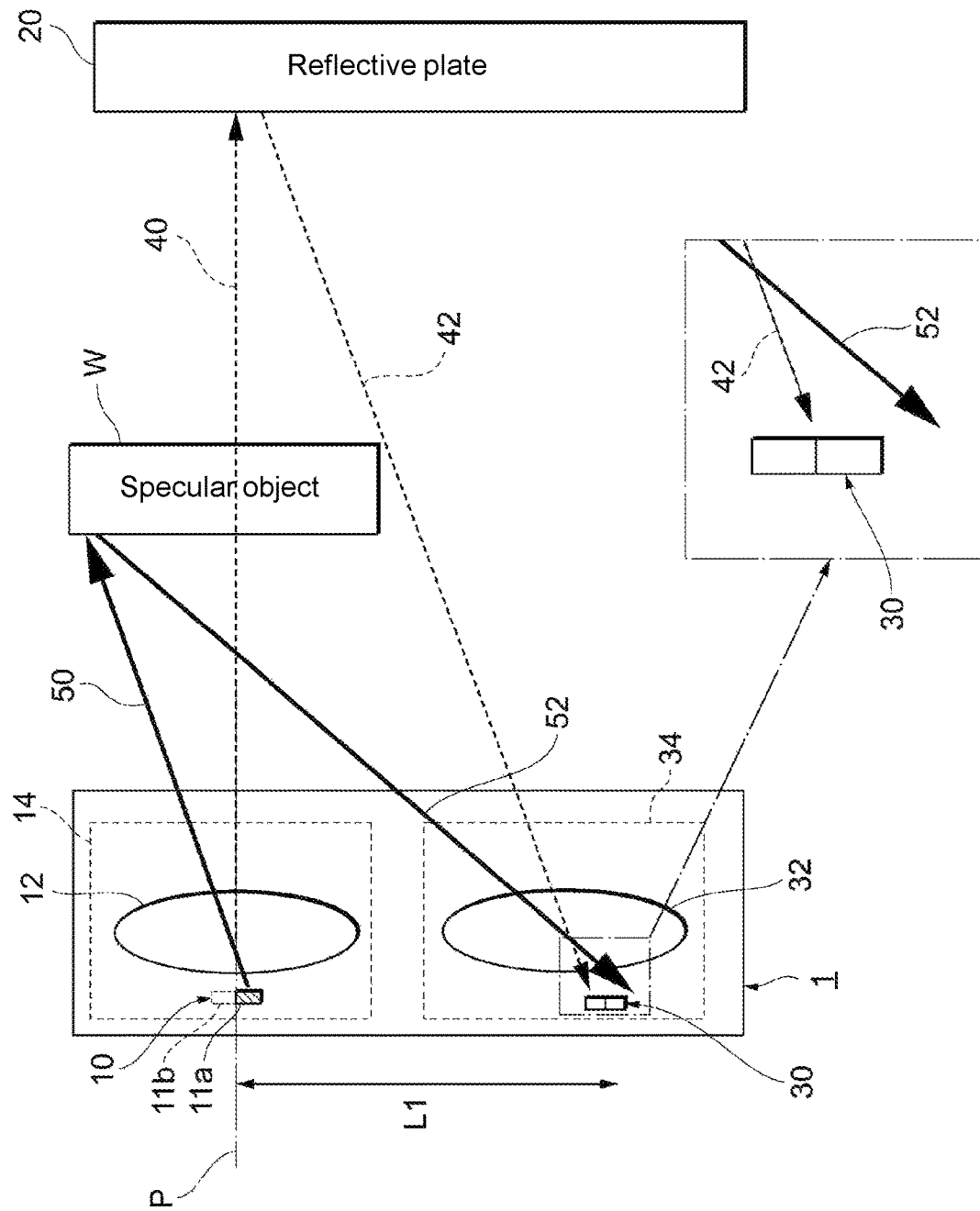
FIG. 1 is a principle diagram of a photoelectronic sensor according to a first embodiment.

A photoelectronic sensor according to an embodiment of the present disclosure includes: a light projecting unit, having a light projecting lens converging light and a light projecting element projecting light toward a reflective plate via the light projecting lens; and a light receiving unit disposed alongside the light projecting unit, having a light receiving lens concentrating reflected light from the reflective plate and a light receiving element receiving the reflected light via the light receiving lens, wherein the light projecting element has a light emitting area and a non-light emitting area, the light emitting area being located on a side closer to the light receiving element than an optical axis of the light projecting lens and emitting light and the non-light emitting area being located on a side farther from the light receiving element than the optical axis and not emitting light.

According to this embodiment, in the light projecting element of the photoelectronic sensor, by having the light emitting area and the non-light emitting area, while the light for object detection is projected, projection of light that could be a main cause of the mirror reflected light incident on the light receiving element can be suppressed. Therefore, a specular malfunction can be easily suppressed and stability of the detection operation can be easily improved.

In the above embodiment, the light emitting area may be divided into a plurality of partial areas that selectively emit light.

According to this embodiment, since the light projecting element can selectively emit light for each partial area, it is possible to realize differences in projected light spot diameter and amount of light by the same light projecting element module.

In the above embodiment, the light projecting element may have a plurality of LED elements that are disposed on a substrate. The LED elements disposed in the light emitting area may be electrically connected to electrodes of the substrate via wires, and the LED elements disposed in the non-light emitting area may not be electrically connected to the electrodes of the substrate.

According to this embodiment, it is possible to easily form the light emitting area and the non-light emitting area by connecting or not connecting to the wires.

A sensor system according to an embodiment of the present disclosure includes the photoelectronic sensor, and a relay apparatus receiving control data for controlling the photoelectronic sensor from an external terminal apparatus connected via a network, wherein the photoelectronic sensor further has a communication interface capable of digitally communicating with the relay apparatus, and the light projecting element causes an area located on a side closer to the light receiving element than the optical axis of the light projecting lens to emit light and causes an area located on a side farther from the light receiving element than the optical axis to not emit light based on the control data received from the replay apparatus.

According to this embodiment, in the sensor system using the photoelectronic sensor, by the control from the external terminal apparatus, it is possible to easily form the light emitting area and the non-light emitting area and improve stability of the detection operation.

According to the present disclosure, it is possible to provide the photoelectronic sensor and the sensor system capable of easily improving operation stability.

First Embodiment

An embodiment (hereinafter referred to as a "first embodiment") of the present disclosure will be explained with reference to the accompanying drawings. In the drawings, those denoted by the same reference numeral have the same or similar configuration.

<Basic Principle>

A principle of a photoelectronic sensor according to the first embodiment will be explained using FIG. 1. FIG. 1 schematically illustrates the principle of the photoelectronic sensor according to the present embodiment. For easy understanding of the explanation, projection light and reflected light are illustrated as representative light beams only.

A photoelectronic sensor 1 according to the present embodiment is a retroreflective photoelectronic sensor for detecting existence of an object, and the like. Inside the photoelectronic sensor 1, a light projecting unit 14 and a light receiving unit 34 are disposed alongside each other. The photoelectronic sensor 1 projects light from the light projecting unit 14 toward a reflective plate 20 that is disposed facing the photoelectronic sensor 1 with a detection area sandwiched therebetween and receives reflected light from the reflective plate 20 by the light receiving unit 34. Since a detected object passing through the detection area shields the projected light, the photoelectronic sensor 1 grasps a reduction in the amount of light received by the light receiving unit 34 and performs the detection.

The light projecting unit 14 includes a light projecting element 10 and a light projecting lens 12. The light projecting element 10 is an element for projecting light toward the reflective plate 20 via the light projecting lens 12. The light projecting element 10 may be, for example, an element such as a light emitting diode (LED), a laser diode (LD), or the like. By using an LED element as the light projecting element 10, a later-described light emitting area can be accurately implemented.

In addition, the light projecting element 10 has a light emitting area 11a that is located on a side closer to a light receiving element 30 than an optical axis P of the light projecting lens 12, the side being hereinafter simply referred to as the "side close to the light receiving element 30", and that emits light, and a non-light emitting area 11b that is located on a side farther from the light receiving element 30 than the optical axis P, the side being hereinafter simply referred to as the "side far from the light receiving element 30", and that does not emit light. The light projecting lens 12 is a lens for converging the light projected from the light projecting element 10.

Herein, the "light emitting area" is an area in the light projecting element 10 that emits light, while the "non-light emitting area" is an area in the light projecting element 10 that does not emit light. For the light emitting area and the non-light emitting area, for example, the light emitting elements such as LED elements or the like may be disposed in both areas, or emission or non-emission of light may be selected by wire bonding to be described later. Accordingly, by wire bonding or the like, the light emitting area and the non-light emitting area can be easily formed.

The light receiving unit 34 includes the light receiving element 30 and a light receiving lens 32. The light receiving element 30 is an element for receiving reflected light 42 from the reflective plate 20 via the light receiving lens 32. The light receiving element 30 may be, for example, a photodiode, a position detecting element, or the like. The light receiving lens 32 is an optical adjustment means for forming the light incident from the detection area and the like into an image on the light receiving element 30, and is, for example, a lens concentrating the reflected light 42 from the reflective plate 20.

The photoelectronic sensor 1 projects projection light 40 from the light emitting area 11a of the light projecting element 10 toward the reflective plate 20. In the photoelectronic sensor 1, in the case where there is no specular object W serving as the detected object in the detection area, the projection light 40 is converged via the light projecting lens 12 to reach the reflective plate 20. Thereafter, the projection light 40 is reflected by the reflective plate 20 and then becomes the reflected light (regressive light) 42. The reflected light 42 is concentrated by the light receiving lens 32 and then is received by the light receiving element 30. In the example of FIG. 1, although it is described that the reflected light 42 forms a predetermined angle relative to the projection light 40 so as to facilitate the explanation, actually, since the reflective plate 20 is disposed at an interval away from the light projecting and receiving unit compared to a baseline length (light emitting and receiving interval) L1, an optical path of the reflected light 42 is changed and the reflected light 42 is reflected by the reflective plate 20 so as to be opposed substantially parallel to the projection light 40. By being reflected substantially parallel to the projection light 40 in this manner, the reflected light 42 is incident on the light receiving lens 32 substantially parallel to an optical axis of the light receiving lens 32, and therefore can be concentrated by the light receiving lens 32 and received by the light receiving element 30.

On the other hand, in the photoelectronic sensor 1, in the case where the specular object W exists in the detection area, projection light 50 from the light emitting area 11a is projected on the specular object W via the light projecting lens 12 and is reflected by the specular object W to become mirror reflected light 52. Unlike the above reflected light 42 that is substantially parallel incident, the mirror reflected light 52 is incident at a certain angle with respect to the optical axis of the light receiving lens 32, and therefore is concentrated in a position away from the optical axis of the light receiving lens 32 and cannot be received by the light receiving element 30. Accordingly, when the specular object W exists in the detection area, the photoelectronic sensor 1 can grasp a reduction in the amount of light received by the light receiving element 30 and can detect the existence of the specular object W.

According to the above configuration, in the retroreflective photoelectronic sensor, while the light for object detection is projected by the light emitting area, projection of light that could be a main cause of the mirror reflected light incident on the light receiving element can be suppressed by providing the non-light emitting area. Therefore, a specular malfunction can be easily suppressed and stability of the detection operation can be easily improved.

Figure 7:
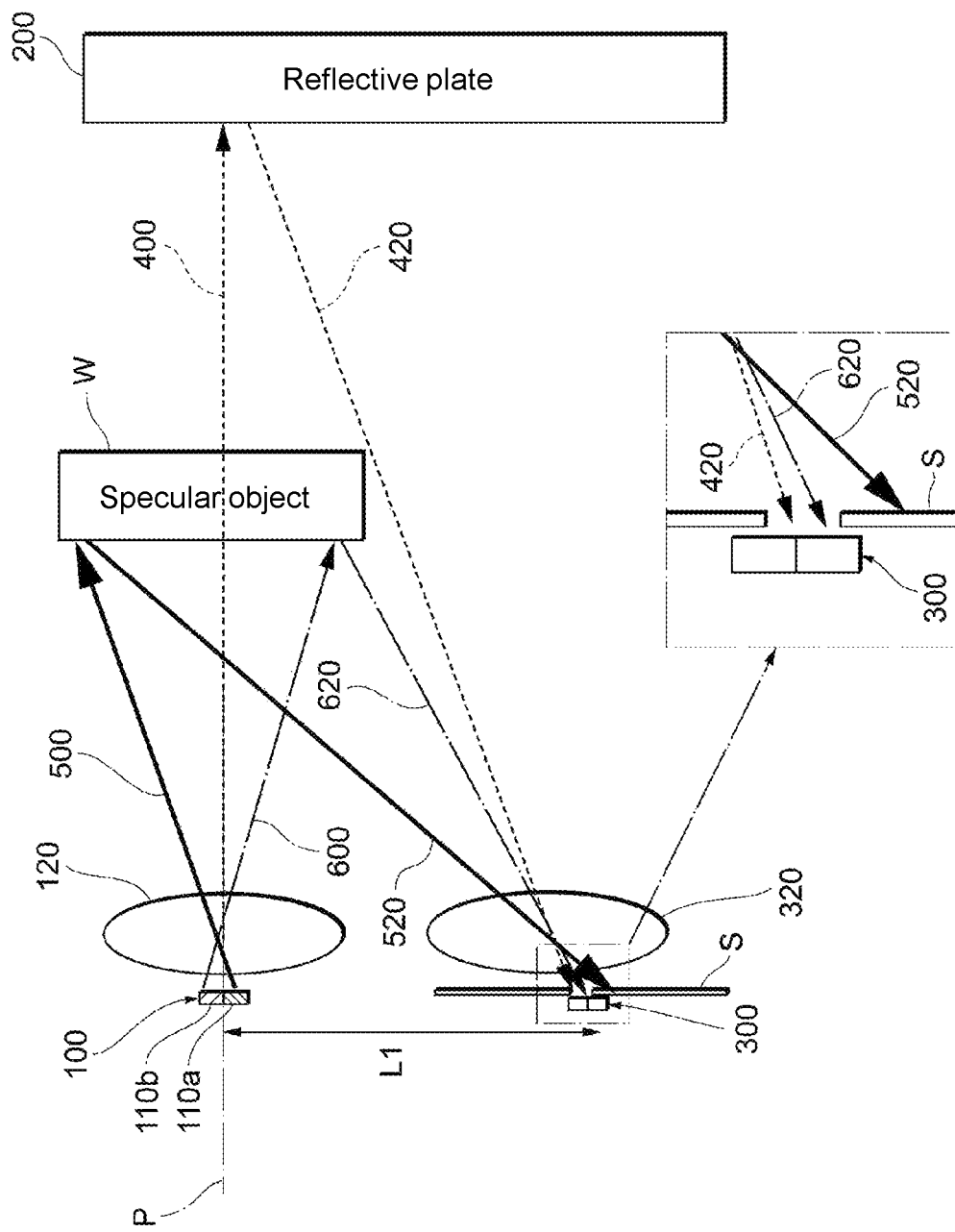
FIG. 7 is a principle diagram of occurrence of a specular malfunction of the conventional retroreflective photoelectronic sensor.

In the conventional retroreflective photoelectronic sensor illustrated in FIG. 7, although it is conceivable to increase the baseline length (light projecting and receiving interval) L1 to thereby create a difference between incident angles of the reflected light 420 and the mirror reflected light 620 with respect to the optical axis of the light receiving lens 320 and make it easier for the light shielding plate S to shield light, as the baseline length is increased, the photoelectronic sensor 1 may be accordingly increased in size. Therefore, it may become difficult to dispose the photoelectronic sensor 1 in various detection environments or arrangement places. Further, although a method of shielding the projection light being a main cause of the mirror reflected light by the light shielding plate may also be considered, there is an aspect that a position of the light shielding plate is required to be controlled with high precision, and the assembly is troublesome.

<Configuration Example of Light Projecting Element>

Figure 2B:
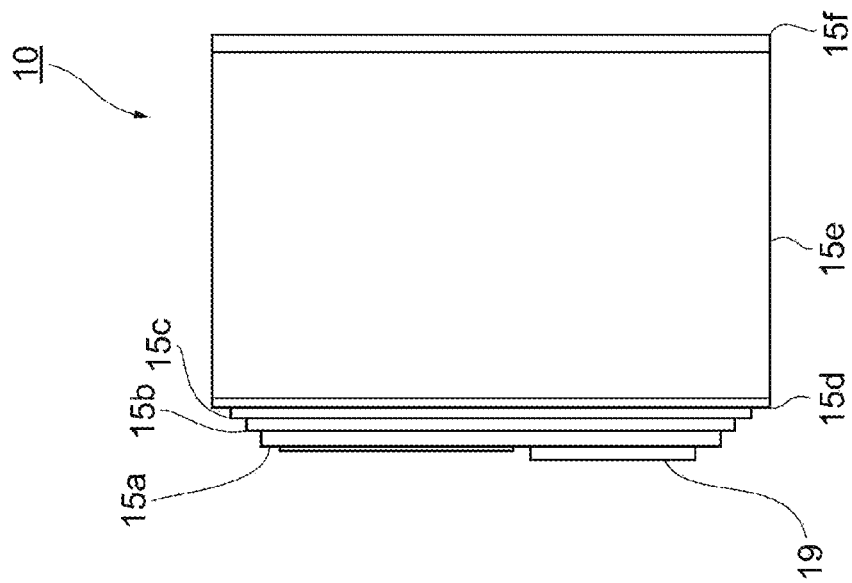
FIG. 2B is a side view illustrating a configuration of the light projecting element according to the first embodiment.
Figure 2A:
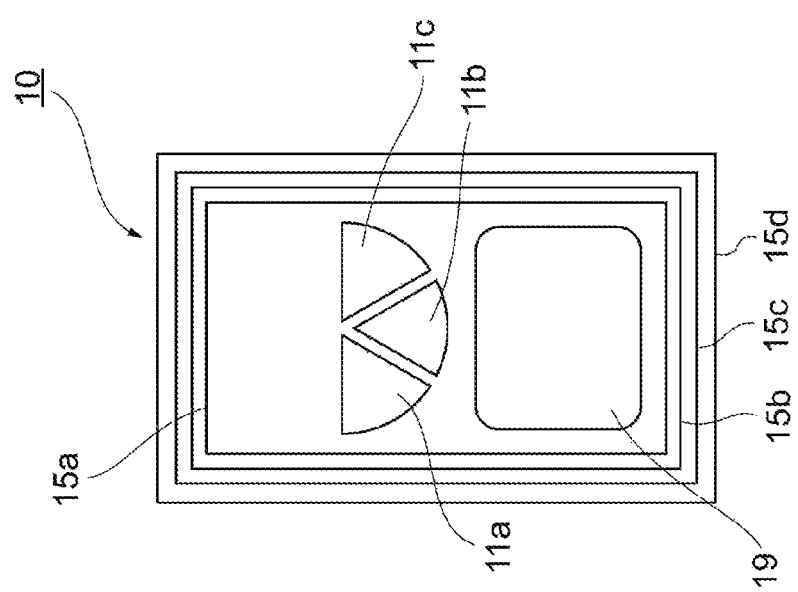
FIG. 2A is a plan view illustrating a configuration of a light projecting element according to the first embodiment.

An example of a configuration of the light projecting element 10 (LED chip) according to the present embodiment will be described using FIGS. 2A and 2B. FIG. 2A is a plan view showing an example of the configuration of the light projecting element 10. FIG. 2B is a side view showing an example of the configuration of the light projecting element 10. Although in the example of FIGS. 2A and 2B, only the light projecting element 10 is shown, when the light projecting element 10 is viewed in a plan view, the light receiving element 30 may be arranged alongside in a longitudinal direction of the light projecting element 10 and disposed on a side of a bonding pad 19.

In the example of FIGS. 2A and 2B, the light projecting element 10 is formed of the light emitting area 11a, a light emitting area 11b, and a light emitting area 11c (hereinafter collectively referred to as a "light emitting area 11"), a p electrode 15a, a p-type cladding layer 15b, an active layer 15c, an n-type cladding layer 15d, an n-type substrate 15e, an n electrode 15f, and the bonding pad 19.

The light projecting element 10 may have the active layer 15c that is located between the p-type cladding layer 15b and the n-type cladding layer 15d and may further have the n-type substrate 15e as a single crystal substrate. An LED element included in the light projecting element 10 is capable of efficiently generating light from the active layer 15c by flowing an electric current between the p electrode 15a and the n electrode 15f. Further, the light projecting element 10 is configured so that, when viewed in a plan view, the p electrode 15a is disposed to cover the p-type cladding layer 15b except the light emitting area 11, and the light generated by the active layer 15c is emitted from the light emitting area 11 to the outside. The p electrode 15a may have a thickness enough to shield the light generated by the active layer 15c. According to such a configuration, the light from the active layer 15c can be emitted only in the light emitting area 11. Alternatively, in a plan view of the light projecting element 10, the active layer 15c may have a structure so as to emit light according to a light emitting pattern of the light emitting area 11. The light emitting area 11 may only be an area of a semicircular portion located closer to the light receiving element 30 than an optical axis of a light projecting lens (not shown) in a substantially circular area centered on the optical axis of the light projecting lens (not shown). According to such a configuration, light emission can only be performed by the area located on a side closer to the light receiving element 30 than the optical axis of the light projecting lens (not shown).

The p electrode 15a and the n electrode 15f are made of a gold alloy.

Each layer of a p-type semiconductor and an n-type semiconductor may be, for example, formed by a double hetero-structure made of a compound semiconductor such as GaAs, GaP, AlGaInP, InGaN, etc. which is stacked by epitaxial growth; specifically, the p-type cladding layer 15$b$ and the n-type cladding layer 15$d$ may be formed of a compound semiconductor of a GaAs-based ternary system or a Si-based semiconductor, the active layer 15$c$ may be formed of a quaternary system compound semiconductor such as AlGaInP, etc., and the n-type substrate 15$e$ may be formed of GaAs.

The bonding pad 19 is an electrode for electrically connecting the LED element to external wiring. The bonding pad 19 may be provided on the p electrode 15$a$ and may be electrically connected to the external wiring via a wire (not shown).

<Example of Light Emitting Pattern>

Figure 3B:
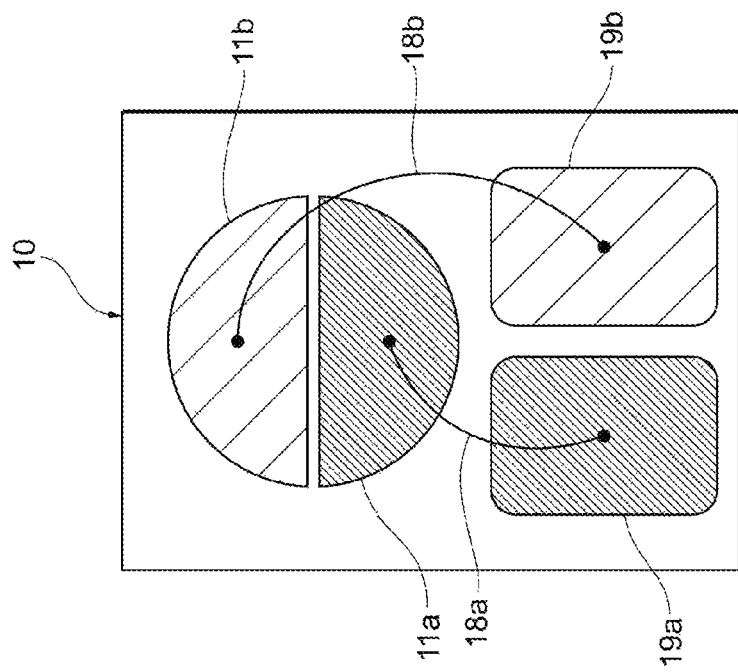

Examples of the light emitting pattern of the light projecting element 10 according to the present embodiment will be explained using FIGS. 3A and 3B. The examples of FIGS. 3A and 3B are explained as the light receiving element 30 shown in FIG. 1 is located at the bottom of the drawings, the side close to the light receiving element 30 is defined as a lower side of the drawings, and the side far from the light receiving element 30 is defined as an upper side of the drawings.

Figure 3A:
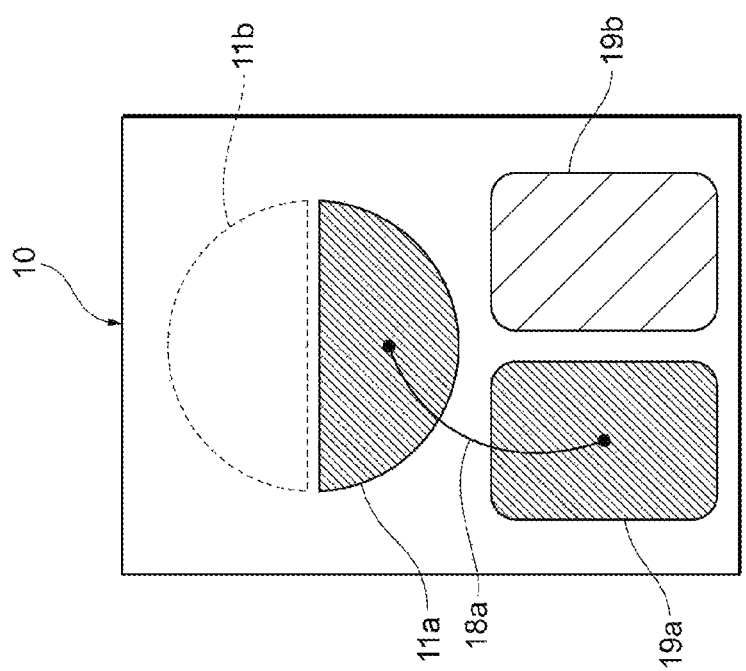

FIG. 3A is a diagram schematically illustrating an example of the light emitting pattern of the light projecting element 10. FIG. 3B is a diagram schematically illustrating another example of the light emitting pattern of the light projecting element 10.

In the example of FIG. 3A, the light projecting element 10 has the light emitting area 11$a$ on the side close to the light receiving element 30 and the non-light emitting area 11$b$ on the side far from the light receiving element 30. The light emitting area 11$a$ and the non-light emitting area 11$b$ may be respectively formed by dividing an area where the light emitting elements are disposed into two areas, i.e., the area on the side close to the light receiving element 30 and the area on the side far from the light receiving element 30.

The light emitting area 11$a$ is, for example, electrically connected to a bonding pad 19$a$ that is disposed in the light projecting element 10 via a wire 18$a$. The non-light emitting area 11$b$ is, for example, not electrically connected to a bonding pad 19$b$ that is disposed in the light projecting element 10. According to such a configuration, in the light projecting element 10, since the light emitting area 11$a$ and the non-light emitting area 11$b$ can be easily formed by connecting or not connecting to the wire, specular malfunction can be suppressed and stability of the detection operation can be improved.

In the example of FIG. 3B, in the light projecting element 10, the light emitting area 11$a$ is formed on the side close to the light receiving element 30 and the light emitting area 11$b$ is also formed on the side far from the light receiving element 30. The light emitting area 11$a$ may be connected to the bonding pad 19$a$ via the wire 18$a$, and the light emitting area 11$b$ may be electrically connected to the bonding pad 19$b$ via a wire 18$b$.

According to the above configuration, the light projecting element 10 can change its light emitting pattern by electrically connecting or not electrically connecting the area 11$b$ to the bonding pad 19$b$ by the wire 18$b$. Accordingly, in the light projecting element 10, for example, by using the same light projecting element module and only changing the connection of the wire, the light emitting pattern of FIG. 3A can be used in the case where it is desired to secure operation stability even at the expense of detection distance, and the light emitting pattern of FIG. 3B can be used in the case where it is desired to increase the detection distance even at the expense of operation stability. That is, it is possible to provide a highly versatile photoelectronic sensor capable of easily realizing a change in the light emitting pattern using the same sensor module.

In the light projecting element 10, for example, the light emitting area 11$a$ may further be divided into a plurality of partial areas. In addition, a plurality of bonding pads may be disposed corresponding to the partial areas and may be connected to the partial areas via wires respectively. According to such a configuration, by using the same light projecting element module and only changing the connection of the wire, a projected light spot diameter and the amount of light can be easily changed. Accordingly, it is possible to provide a highly versatile photoelectronic sensor that realizes differences in the projected light spot diameter and the amount of light by the same light projecting element module.

Second Embodiment

Next, a second embodiment of the present disclosure will be described. In the drawings, those denoted by the same reference numerals have the same or similar configuration. The second embodiment is an embodiment of a sensor system using the photoelectronic sensor according to the first embodiment. Only the differences from the first embodiment will be described below.

<System Configuration Example>

Figure 4:
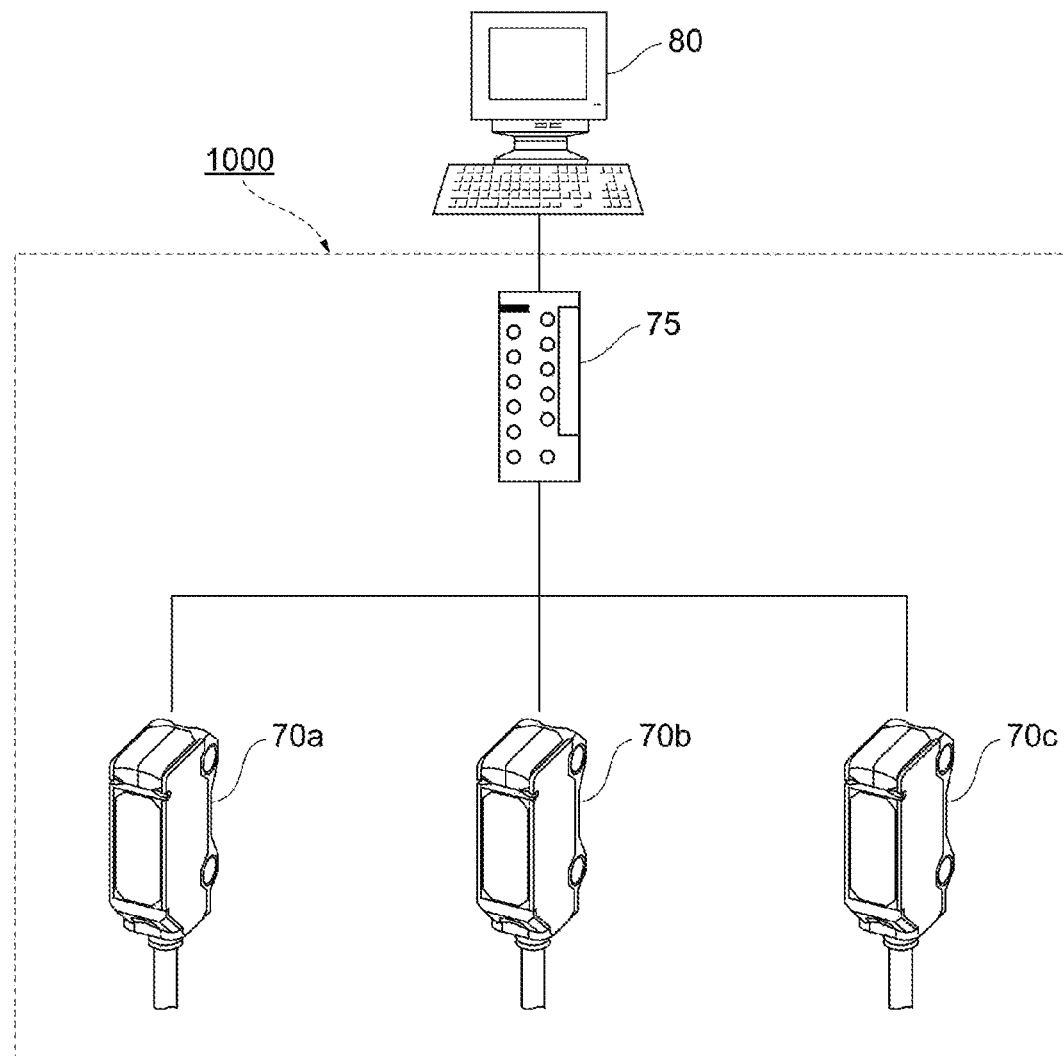
FIG. 4 is a system diagram illustrating a system configuration of a sensor system according to a second embodiment.

An example of the system configuration of a sensor system 1000 according to the present embodiment will be described using FIG. 4.

The sensor system 1000 is, for example, a system using a communication protocol such as an IO-Link (registered trademark) protocol, etc. The sensor system 1000 is a system that digitizes a sensor including the photoelectronic sensor according to the first embodiment, an actuator, etc. and capable of communicating with an external terminal apparatus connected via a network. The system using the IO-Link is, for example, a system including a master apparatus (control apparatus), a slave apparatus (relay apparatus) and a device such as a sensor, etc., wherein the master apparatus performs operation control of the device and receives output data of the device via the slave apparatus. This content has been explained in detail in the past patent documents (e.g., Japanese Laid-open No. 2017-167593), etc. of the applicant, and therefore the explanation will be omitted herein.

In photoelectronic sensors 70$a$, 70$b$ and 70$c$ (hereinafter collectively referred to as a "photoelectronic sensor 70") of the sensor system 1000, all areas with light emitting elements disposed therein are electrically connected to external wiring. Formation of a light emitting area and a non-light emitting area in the photoelectronic sensor 70 is controlled by control data transmitted from a terminal apparatus 80 equivalent to the above master apparatus to the photoelectronic sensor 70 equivalent to the above device and designating the light emitting element through which an electric current flows.

Herein, the "control data" is data for controlling a light emitting operation of the photoelectronic sensor 70, and is data for, for example, designating which light emitting element of the photoelectronic sensor 70 the electric current flows through (which light emitting element is to be lit up) or for adjusting a voltage applied to the light emitting element (the amount of light of the light emitting element). In addition, the control data may include data (e.g., Light-On/Dark-On settings that define whether to output an ON signal upon detection of light or to output the ON signal when no light is detected) for controlling the detection operation of the photoelectronic sensor 70.

The photoelectronic sensor 70 has the same configuration and function as the photoelectronic sensor 1 according to the first embodiment. A difference from the first embodiment is that in the photoelectronic sensor 70, all the light emitting elements are electrically connected to the external wiring via the wires. In the photoelectronic sensor 70, at least some of the light emitting elements are lit up and to form the light emitting area and the non-light emitting area based on the control data transmitted from the external terminal apparatus 80 and received via a relay apparatus 75. According to such a configuration, in the photoelectronic sensor 70, without changing physical connection by wire bonding, by the control data from the terminal apparatus 80, the light emitting area and the non-light emitting area can be formed, and the light emitting pattern can be changed. Further, the photoelectronic sensor 70 may, for example, further have a communication interface capable of digitally communicating with the relay apparatus 75.

The relay apparatus 75 is an apparatus for relaying various data between the external terminal apparatus 80 connected via a network and the photoelectronic sensor 70, such as receiving the control data from the external terminal apparatus 80, transmitting the control data to the photoelectronic sensor 70, and so on.

The terminal apparatus 80 is a terminal for operating a device such as a sensor, an actuator, etc. and is, for example, a programmable logic controller (PLC), a human machine interface (HMI), etc. For example, the terminal apparatus 80 accepts operation input of a light emitting operation in the photoelectronic sensor 70 from a user and generates the control data indicating a light emitting operation such as through which light emitting element an electric current flows and, which level of voltage is to be applied and so on based on the accepted input content. The terminal apparatus 80 transmits the generated control data to the photoelectronic sensor 70 via the relay apparatus 75 and the network.

The sensor system 1000 is a system including the relay apparatus 75 and the photoelectronic sensor 70. In the sensor system 1000, the external terminal apparatus 80 is equivalent to the master apparatus in the above system using the IO-Link, and the relay apparatus 75 is equivalent to the slave apparatus in the above system using the IO-Link. In FIG. 4, although one relay apparatus 75 and three photoelectronic sensors 70 are shown, the number of each of the relay apparatus 75 and the photoelectronic sensor 70 may be one or more.

In the sensor system 1000, based on the control data for controlling the photoelectronic sensor 70 that is received from the relay apparatus 75, an area in the photoelectronic sensor 70 located on the side close to the light receiving element 30 (not shown) is caused to emit light and an area located on the side far from the light receiving element 30 (not shown) is caused to emit light.

According to the above configuration, by operation from the external terminal apparatus 80, the light emitting pattern of the photoelectronic sensor 70 can be changed. Therefore, it is possible to provide a sensor system that achieves both stability of the detection operation and an increase in versatility.

<Configuration Example of Light Projecting Element>

A configuration of the light projecting element of the photoelectronic sensor 70 according to the present embodiment is the same as the first embodiment. A difference from the first embodiment is that in the light projecting element according to the present embodiment, for example, all the areas where light emitting elements are disposed, including the light emitting area and the non-light emitting area, are electrically connected to the external wiring via the wires.

<Example of Light Emitting Pattern>

Examples of the light emitting pattern of the light projecting element 10 of the photoelectronic sensor 70 according to the present embodiment will be described using FIGS. 5A and B. The examples of FIGS. 5A and B are explained as the light receiving element 30 shown in FIG. 1 is located at the bottom of the drawings, the side close to the light receiving element 30 is defined as a lower side of the drawings, and the side far from the light receiving element 30 is defined as an upper side of the drawings.

Figure 5B:
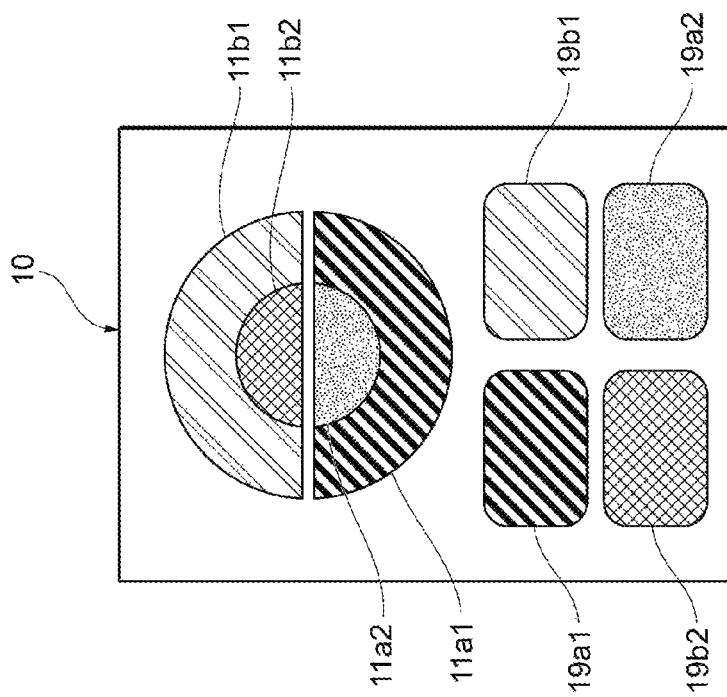
Figure 5A:
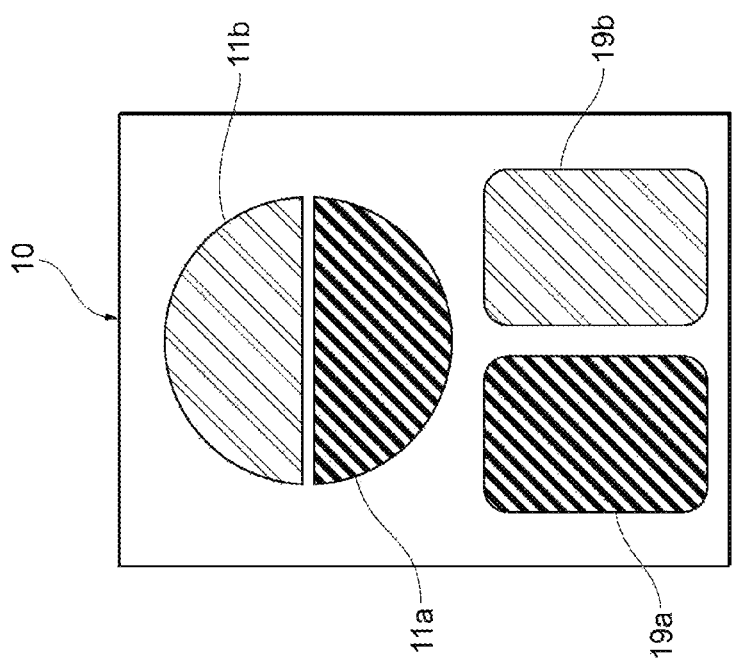
Figure 6:
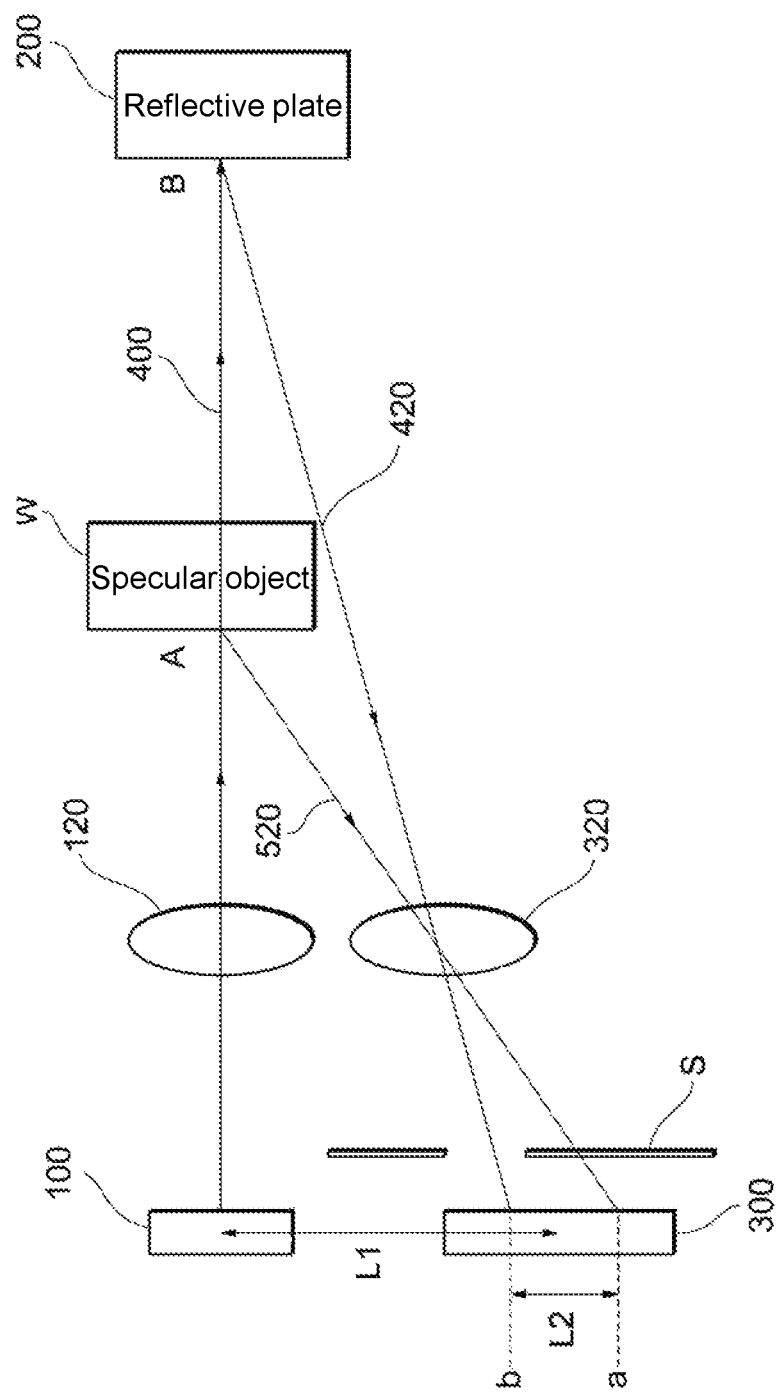
FIG. 6 is a principle diagram of a conventional retroreflective photoelectronic sensor.

FIG. 5A is a diagram schematically illustrating an example of the light emitting pattern of the light projecting element 10. FIG. 5B is a diagram schematically illustrating another example of the light emitting pattern of the light projecting element 10.

In the example of FIG. 5A, an area of the light projecting element 10 is divided into two areas, i.e., an area 11a located on the side close to the light receiving element 30 and an area 11b located on the side far from the light receiving element 30. The areas 11a and 11b are electrically connected to the bonding pads 19a and 19b via bonding wires (not shown) respectively. In the sensor system 1000, for example, in the case where the photoelectronic sensor 70 is used as a retroreflective photoelectronic sensor, control may be performed from the terminal apparatus 80 to only light up the light emitting elements disposed in the area 11a so as to set the area 11a as a light emitting area and the area 11b as a non-light emitting area. On the other hand, in the sensor system 1000, in the case where the photoelectronic sensor 70 is used as a transmissive photoelectronic sensor, control may be performed from the terminal apparatus 80 to light up the light emitting elements disposed in the respective areas to set both the areas 11a and 11b as light emitting areas. According to such a configuration, by using the same sensor module without physically changing the connection to the bonding wires, only by operation from the terminal apparatus 80, the light emitting pattern can be changed and various uses are possible. That is, it is possible to realize a highly versatile sensor system while ensuring stability of the detection operation.

Herein, the "transmissive photoelectronic sensor" is a photoelectronic sensor in which a light projecting unit that projects light and a light receiving unit that receives projection light of the light projecting unit are disposed facing each other, and the projection light from the light projecting unit projected on the light receiving unit in a substantially straight line manner. In the transmissive photoelectronic sensor, a detection area is provided between the light projecting unit and the light receiving unit that are disposed facing each other, an detected object passing through the detection area shields the projection light, and the amount of light received by the light receiving unit decreases, thereby detecting the detected object.

In the example of FIG. 5B, the light projecting element 10 is further divided from that in the example of FIG. 5A into a plurality of partial areas, such that the area 11a is divided into partial areas 11a1 and 11a2 and the area 11b is divided into partial areas 11b1 and 11b2 and the partial areas selectively emit light. The areas 11a1, 11a2, 11b1 and 11b2 are electrically connected to bonding pads 19a1, 19a2, 19b1 and 19b2 via bonding wires (not shown) respectively. According to such a configuration, since the projected light spot diameter and the amount of light can be easily changed using the same sensor module, it is possible to provide a highly versatile sensor system that realizes differences in the projected light spot diameter and the amount of light by the same light projecting element module.

[Others]

The photoelectronic sensor according to the present disclosure can also be used for a distance setting type of a diffuse-reflection-type photoelectronic sensor. By changing the light emitting pattern of the light projecting element, it is possible to easily adjust a set distance without adjusting a position of a lens. In the case of such use, the light receiving element uses a two-division photodiode in which a distance from a sensor body and the detected object is divided into two areas, i.e., the near side and the far side.

Herein, the "diffuse-reflection-type photoelectronic sensor" is a photoelectronic sensor in which the light projecting unit projecting light and the light receiving unit receiving the projection light of the light projecting unit are disposed alongside each other, the projection light from the light projecting unit irradiates the detected object and diffuse-reflection light is received from the detected object. The diffuse-reflection-type photoelectronic sensor detects the existence of the detected object and the like by an increase in the amount of the diffuse-reflection light received from the detected object.

The embodiments described above are intended to facilitate understanding of the present disclosure, but not to limit the present disclosure. Each element included in the embodiments and the arrangement, material, condition, shape and size thereof, etc. are not limited to what has been illustrated and instead can be appropriately changed. In addition, it is possible to partially replace or combine the components shown in different embodiments.

What is claimed is:

1. A photoelectronic sensor, comprising:
   a light projecting unit, having a light projecting lens converging light and a light projecting element projecting light toward a reflective plate via the light projecting lens; and
   a light receiving unit disposed alongside the light projecting unit, having a light receiving lens concentrating reflected light from the reflective plate and a light receiving element receiving the reflected light via the light receiving lens, wherein
      the light projecting element has a light emitting area and a non-light emitting area, the light emitting area being located on a side closer to the light receiving element than an optical axis of the light projecting lens and emitting light, and the non-light emitting area being located on a side farther from the light receiving element than the optical axis and not emitting light, wherein the light projecting element has a plurality of LED elements that are disposed on a substrate, wherein the LED elements disposed in the light emitting area are electrically connected to electrodes of the substrate via wires, and the LED elements disposed in the non-light emitting area are not electrically connected to electrodes of the substrate.

2. The photoelectronic sensor according to claim 1, wherein the light emitting area is divided into a plurality of partial areas that selectively emit light.

3. The photoelectronic sensor according to claim 2, wherein the light projecting element has a plurality of LED elements that are disposed on a substrate, wherein the LED elements disposed in the light emitting area are electrically connected to electrodes of the substrate via wires, and the LED elements disposed in the non-light emitting area are not electrically connected to electrodes of the substrate.

4. A sensor system, comprising:
   the photoelectronic sensor according to claim 2; and
   a relay apparatus, receiving control data for controlling the photoelectronic sensor from an external terminal apparatus connected via a network and transmitting the control data to the photoelectronic sensor, wherein
   the photoelectronic sensor further has a communication interface capable of digitally communicating with the relay apparatus, and
   the light projecting element causes an area located on a side closer to the light receiving element than the optical axis of the light projecting lens to emit light and causes an area located on a side farther from the light receiving element than the optical axis to not emit light based on the control data received from the relay apparatus.

5. A sensor system, comprising:
   the photoelectronic sensor according to claim 1; and
   a relay apparatus, receiving control data for controlling the photoelectronic sensor from an external terminal apparatus connected via a network and transmitting the control data to the photoelectronic sensor, wherein
   the photoelectronic sensor further has a communication interface capable of digitally communicating with the relay apparatus, and
   the light projecting element causes an area located on a side closer to the light receiving element than the optical axis of the light projecting lens to emit light and causes an area located on a side farther from the light receiving element than the optical axis to not emit light based on the control data received from the relay apparatus.

* * * * *